(12) United States Patent
Wang et al.

(10) Patent No.: US 11,757,069 B2
(45) Date of Patent: Sep. 12, 2023

(54) LED WHITE LIGHT DEVICE, PREPARATION METHOD THEREOF, AND LED BACKLIGHT MODULE

(71) Applicant: FOSHAN NATIONSTAR OPTOELECTRONICS CO., LTD, Guangdong (CN)

(72) Inventors: Haijun Wang, Guangdong (CN); Yangcheng Huang, Guangdong (CN); Xiang Chen, Guangdong (CN); Fabo Liu, Guangdong (CN); Zhonghai Yan, Guangdong (CN); Danlei Gong, Guangdong (CN); Junhua Chen, Guangdong (CN); Yushan Lin, Guangdong (CN); Jian Gan, Guangdong (CN); Haixing Tan, Guangdong (CN)

(73) Assignee: FOSHAN NATIONSTAR OPTOELECTRONICS CO., LTD, Foshan (CN)

( * ) Notice: Subject to any disclaimer, the term of this patent is extended or adjusted under 35 U.S.C. 154(b) by 0 days.

(21) Appl. No.: 16/609,453

(22) PCT Filed: Oct. 23, 2018

(86) PCT No.: PCT/CN2018/111518
§ 371 (c)(1),
(2) Date: Oct. 30, 2019

(87) PCT Pub. No.: WO2020/034391
PCT Pub. Date: Feb. 20, 2020

(65) Prior Publication Data
US 2021/0167256 A1    Jun. 3, 2021

(30) Foreign Application Priority Data

Aug. 16, 2018 (CN) .......................... 201810932962.9

(51) Int. Cl.
*H01L 33/50* (2010.01)
*C09K 11/77* (2006.01)
*C09K 11/08* (2006.01)

(52) U.S. Cl.
CPC ........ *H01L 33/504* (2013.01); *C09K 11/0883* (2013.01); *C09K 11/77348* (2021.01); *C09K 11/77927* (2021.01); *H01L 2933/0041* (2013.01)

(58) Field of Classification Search
CPC .......... H01L 33/504; H01L 2933/0041; C09K 11/0883; C09K 11/77348; C09K 11/77927; C09K 11/77747; Y02B 20/00
See application file for complete search history.

(56) References Cited

U.S. PATENT DOCUMENTS

| 2013/0033167 A1* | 2/2013 | Dong ................... H01L 33/504 252/301.4 R |
| 2015/0184813 A1 | 7/2015 | Harbers et al. |

(Continued)

FOREIGN PATENT DOCUMENTS

| CN | 102916113 A | 2/2013 |
| CN | 104051601 A | 9/2014 |

(Continued)

*Primary Examiner* — Su C Kim
(74) *Attorney, Agent, or Firm* — Gang Yu

(57) ABSTRACT

The disclosure provides an LED white light device, including a blue light chip and phosphors. The blue light chip has a band of (455-470) nm. The phosphors include a dual-band yellow phosphor and a red phosphor having an excited light peak wavelength range of (610-660) nm. The yellow phosphor and the red phosphor are mixed according to a proportion of 1:(0.03-0.2) and cover the blue light chip, such that blue light emitted by the packaged LED white light device has a peak wavelength range of (450-465) nm. The disclosure also provides a preparation method of an LED white light device and an LED backlight module adopting (Continued)

the above LED white light device. The disclosure achieves the effects of blue light prevention, high color gamut and pure white simultaneously, Color uniformity and consistency are good, and a blue-green-red three-color continuous spectrum is provided, which is closer to a solar spectrum.

13 Claims, 7 Drawing Sheets

(56) References Cited

U.S. PATENT DOCUMENTS

| | | | |
|---|---|---|---|
| 2016/0096991 | A1 | 4/2016 | Hirosaki et al. |
| 2017/0037313 | A1* | 2/2017 | Hirosaki ................. H01L 33/60 |
| 2017/0196060 | A1* | 7/2017 | Watanabe ............... H01L 33/54 |
| 2018/0040775 | A1 | 2/2018 | Wakamatsu et al. |
| 2018/0214903 | A1* | 8/2018 | Ikushima ................ B05C 11/10 |

FOREIGN PATENT DOCUMENTS

| | | | |
|---|---|---|---|
| CN | 105621886 | A | 6/2016 |
| CN | 107623064 | A | 1/2018 |
| CN | 108075031 | A | 5/2018 |

\* cited by examiner

LED WHITE LIGHT DEVICE, PREPARATION METHOD THEREOF, AND LED BACKLIGHT MODULE

TECHNICAL FIELD

The disclosure relates to the field of LED devices, and in particular, to an LED white light device capable of preventing blue light, a preparation method of the LED white light device, and an LED backlight module made of the LED white light device.

BACKGROUND

As a novel solid light source, white LEDs have great application prospects in lighting and display fields due to its advantages of energy saving, environmental protection, long life, small size and the like.

At present, the production scale of domestic white LEDs has been very large. Generally, transparent substrate white LED packages are used. They are mainly used in the fields of advertising signs and general lighting. Typical products such as filaments and luminous characters use transparent (semi-transparent) glass, ceramics and polymer base plates as a package carrier. However, due to limitations in production cost and process conditions, white LED devices currently on the market are usually coated with a fluorescent glue on a blue light LED chip to emit white light. An active layer of the blue light LED chip is generally grown on a transparent substrate. Light emitted by the active layer of the blue light LED chip is emitted from all directions of the blue light LED chip, including the back side of the blue light LED chip. If the blue light LED chip is packaged on a transparent base plate, the back surface of an LED device thus packaged will also leak blue light.

As early as 1966, by researches, Nell and others found that exposure to blue light could cause damage to retinal cells, leading vision to be decreased or even lost. Short-wave blue light having a wavelength of 400-450 nm has the greatest damage to the retina. At the 2010 International Light Association Annual Meeting, the world's top optical experts unanimously pointed out that the short-wave blue light has extremely high energy and can penetrate the lens to reach the retina. Blue light illuminates the retina to produce free radicals, which cause the retinal pigment epithelial cells to die. The decline of epithelial cells could cause light-sensitive cells to lack nutrients to result in visual impairments, and the visual impairments are irreversible.

The existing LED white light devices are coated on the blue light LED chips with the fluorescent glue, and the problem of how to improve the performance of white light devices such as brightness and color gamut should be solved.

Existing technology 1 is CN102916113B, which discloses a phosphor composition and a white light-emitting device using the same. The white light-emitting device includes: a blue light-emitting diode having an emission wavelength range of (440-470) nm; and a phosphor composition, disposed on the blue light-emitting diode, the phosphor composition including: a first yellow phosphor having an emission peak wavelength of (535-545) nm, a second yellow phosphor having an emission peak wavelength of (545-555) nm and a red phosphor having an emission peak wavelength of (645-655) nm, wherein white light has a chromaticity coordinate range of CIE x: 0.25-0.3 and CIE y: 0.22-0.28. That is, existing technology 2 is a technical solution for exciting the first yellow phosphor plus the second yellow phosphor plus the red phosphor by using a blue light chip, but it solves the problem of how to improve the brightness. Moreover, as can also be seen from FIG. 3 of Existing technology 1, the white light-emitting device in Existing technology 1 has a luminescent spectrum peak wavelength range of (440-450) nm, and the problem of blue light cannot be solved. In addition, in Existing technology 1, there is no peak in a red band range, which is greatly different from a solar spectrum. The emitted light is liable to cause fatigue, making it difficult for people to feel comfortable and natural.

SUMMARY

The technical problem to be solved by the disclosure is to provide an LED white light device, which simultaneously achieves the effects of blue light prevention, high color gamut and pure white.

The technical problem to be solved by the disclosure is also to provide an LED white light device, which is good in color uniformity and consistency and has a blue-green-red three-color continuous spectrum that is closer to a solar spectrum.

The technical problem to be solved by the disclosure is further to provide a preparation method of the above LED white light device.

The technical problem to be solved by the disclosure is further to provide an LED backlight module made of the above LED white light device.

To achieve the above technical effects, the disclosure provides an LED white light device, including a blue light chip and phosphors, the blue light chip having a band of (455-470) nm.

The phosphors may include a dual-band yellow phosphor and a red phosphor having an excited light peak wavelength range of (610-660) nm.

The yellow phosphor and the red phosphor may be mixed according to a proportion of 1:(0.03-0.2) and may cover the blue light chip, such that blue light emitted by the packaged LED white light device may have a peak wavelength range of (450-465) nm. A ratio of energy of a spectrum of the packaged LED white light device to energy of a blue light spectrum having a wavelength range of (400-450) nm may be 1:(0.05-0.2).

As an improvement of the above solution, white light of the LED white light device may have a chromaticity coordinate range of CIE x: 0.22-0.32 and CIE y: 0.20-0.32.

As an improvement of the above solution, the LED white light device may have an NTSC color gamut value that is greater than or equal to 70%.

As an improvement of the above solution, the yellow phosphor may be a lanthanum silicon nitrogen compound.

As an improvement of the above solution, the yellow phosphor may include $La_3Si_6N_{11}:Ce^{3+}$ having a peak wavelength of (530-550) nm and (600-620) nm.

As an improvement of the above solution, the red phosphor may be a nitride red phosphor or a $Mn^{4+}$ doped fluoride red phosphor.

As an improvement of the above solution, the red phosphor may include $(SrCa)AlSiN_3:Eu$ having a peak wavelength of (610-660) nm.

Correspondingly, the disclosure also discloses a preparation method of an LED white light device, which may include:

(1) mixing a yellow phosphor and a red phosphor in a proportion, adding the mixture into a packaging glue, stirring uniformly, and then defoaming by vacuuming to obtain a fluorescent glue mixture; and (2) providing the fluorescent glue mixture on an LED support with a blue light chip, and curing to obtain an LED white light device.

Correspondingly, the disclosure also provides an LED backlight module, which may include the above LED white light device.

The implementation of the disclosure has the following beneficial effects.

The LED white light device adopts a blue light chip having a long wavelength of (455-470) nm, which is matched with a redesigned phosphor, specifically a dual-band yellow phosphor and a red phosphor having an excited light peak wavelength range of (610-660) nm. The yellow phosphor and the red phosphor are mixed in a proportion of 1:(0.03-0.2), which can simultaneously achieve the effects of blue light prevention, high color gamut and pure white, as follows:

(1) The LED white light device can convert more than 95% of harmful blue light into long-wave low-energy light of 450 nm or more, solves the problem that blue light harms the eyes from the perspective of hardware, and reduces the damage caused by high-risk blue light to a user.

(2) The LED white light device has a blue-green-red three-color continuous spectrum, and is closer to a solar spectrum, the emitted light makes people feel comfortable and natural, and the LED white light device is beneficial to realize healthy illumination.

(3) The LED white light device adopts two kinds of phosphors, the proportion of the phosphors facilitates mixing, and the phosphors can be uniformly distributed in a packaging glue, thereby improving the light-emitting performance of an LED device, and that is good in color uniformity and consistency.

(4) The brightness of the LED white light device is high, and is almost equal to the brightness of a conventional phosphor.

(5) The color gamut of the LED white light device is high, and an NTSC value may reach more than 70%, which is higher than an NTSC value 68% of a conventional LED device.

(6) The LED device can realize pure white.

DETAILED DESCRIPTION OF THE EMBODIMENTS

In order to make the objectives, technical solutions and advantages of the disclosure clearer, the disclosure will be further described herein below.

Figure 1:
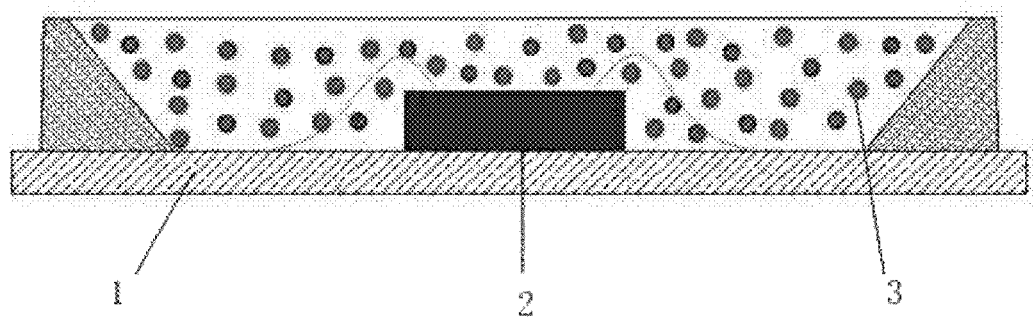
FIG. 1 is a schematic structural diagram of an LED white light device according to the disclosure.

As shown in FIG. 1, the disclosure provides an LED white light device for preventing blue light pollution applied to a backlight system, including an LED support 1, a blue light chip 2 and phosphors 3, wherein the blue light chip 2 is electrically connected to the LED support 1.

The blue light chip 2 has a band of (455-470) nm. The LED white light device adopts a long-wavelength blue light chip. Due to the change of the chip wavelength, if the conventional phosphor combination is used, the color gamut is narrow, and the emitted light is greenish, which cannot meet the requirements of color gamut and pure white. Therefore, the LED white light device needs to be re-matched with a new phosphor combination, specifically:

The phosphors 3 include a dual-band yellow phosphor and a red phosphor having an excited light peak wavelength range of (610-660) nm. The yellow phosphor and the red phosphor are mixed according to a proportion of 1:(0.03-0.2) and cover the blue light chip, such that blue light emitted by the packaged LED white light device has a peak wavelength range of (450-465) nm. A ratio of energy of a spectrum of the packaged LED white light device to energy of a blue light spectrum having a wavelength range of (400-450) nm is 1:(0.05-0.2).

Preferably, the phosphors 3 include a dual-band yellow phosphor and a red phosphor having an excited light peak wavelength range of (630-650) nm. The yellow phosphor and the red phosphor are mixed according to a proportion of 1:(0.03-0.1) and cover the blue light chip, such that blue light emitted by the packaged LED white light device has a peak wavelength range of (455-465) nm. A ratio of energy of a spectrum of the packaged LED white light device to energy of a blue light spectrum having a wavelength range of (400-450) nm is 1:(0.05-0.15).

More preferably, the phosphors 3 include a dual-band yellow phosphor and a red phosphor having an excited light peak wavelength range of (630-650) nm. The yellow phosphor and the red phosphor are mixed according to a proportion of 1:(0.03-0.05) and cover the blue light chip, such that blue light emitted by the packaged LED white light device has a peak wavelength range of (460-465) nm. A ratio of energy of a spectrum of the packaged LED white light device to energy of a blue light spectrum having a wavelength range of (400-450) nm is 1:(0.05-0.1).

The yellow phosphor is, but not limited to, a lanthanum silicon nitrogen compound. Preferably, the yellow phosphor includes $La_3SiN_{11}:Ce^3$ having a peak wavelength of (530-550) nm and (600-620) nm. More preferably, the yellow phosphor includes $La_3Si_6N_{11}:Ce^{3+}$ having a peak wavelength of (530-537) nm and (600-620) nm.

The red phosphor is, but not limited to, a nitride red phosphor or a $Mn^{4+}$ doped fluoride red phosphor. Preferably, the red phosphor includes $(SrCa)AlSiN_3:Eu$ having a peak wavelength of (610-660) nm.

It is to be noted that the proportion of the yellow phosphor to the red phosphor refers to a mass percentage.

It is also to be noted that the above yellow phosphor and red phosphor include, but are not limited to, the above substances, as long as the respective colors conform to the respective prescribed wavelength ranges.

Further, the LED white light device further includes a packaging glue. It is to be noted that the amount of the packaging glue may also be adjusted according to the performance of the LED white light device.

In summary, the LED white light device uses a blue light chip having a long wavelength of (455-470) nm, and is matched with a redesigned phosphor covering the blue light chip to obtain the LED white light device. In the disclosure, the blue light emitted by the packaged LED white light device has a peak wavelength range of (450-465) nm, and a ratio of energy of a spectrum of the packaged LED white light device to energy of a blue light spectrum having a wavelength range of (400-450) nm is 1:(0.05-0.2), so that the LED white light device can convert more than 95% of harmful blue light into long-wave low-energy light of 450 nm or more, solves the problem that blue light harms the eyes from the perspective of hardware, and reduces the damage caused by high-risk blue light to a user.

In the disclosure, the blue light emitted by the packaged LED white light device has a peak wavelength range of (450-465) nm, and a ratio of energy of a spectrum of the packaged LED white light device to energy of a blue light spectrum having a wavelength range of (400-450) nm is 1:(0.05-0.2), so that the LED white light device can convert more than 95% of harmful blue light into long-wave low-energy light of 450 nm or more, solves the problem that blue light harms the eyes from the perspective of hardware, and reduces the damage caused by high-risk blue light to a user.

Correspondingly, the disclosure provides a preparation method of an LED white light device, which includes the steps as follows.

(1) A yellow phosphor and a red phosphor are mixed in a proportion, added into a packaging glue, stirred uniformly, and then defoamed by vacuuming to obtain a fluorescent glue mixture.

(2) The fluorescent glue mixture is provided on an LED support with a blue light chip, and cured to obtain an LED white light device.

The technical details of the yellow phosphor, the red phosphor and the blue light chip used in the preparation method are the same as those described above, and will not be described herein.

Correspondingly, the disclosure also provides an LED backlight module, which may include the above LED white light device. The technical details of the yellow phosphor, the red phosphor and the blue light chip used in the LED white light device are the same as those described above, and will not be described herein.

The disclosure is further illustrated by the following specific embodiments.

Embodiment 1

(1) A commercially available nitride yellow phosphor (component: $La_3S_6N_{11}:Ce^{3+}$) and a nitride red phosphor (component: $(SrCa)AlSiN_3:Eu$) are added Into an LED packaging glue in a ratio of 1:0.03. The red and yellow phosphors and the packaging glue are uniformly mixed by stirring, and defoamed by vacuuming to obtain a fluorescent glue mixture.

(2) The fluorescent glue mixture is dropped into an LED support with a blue light chip, and baked in an oven for a certain time to cure the fluorescent glue mixture to obtain an LED white light device for preventing blue light. The blue light chip selected for the LED device has a band of (455-470) nm, and a blue light peak wavelength corresponding to an LED emission spectrum is (450-465) nm.

Spectral testing and color gamut calculation are performed on the LED white light device of Embodiment 1, and the results are shown in FIGS. 2, 3, 4, and 5.

Figure 2:
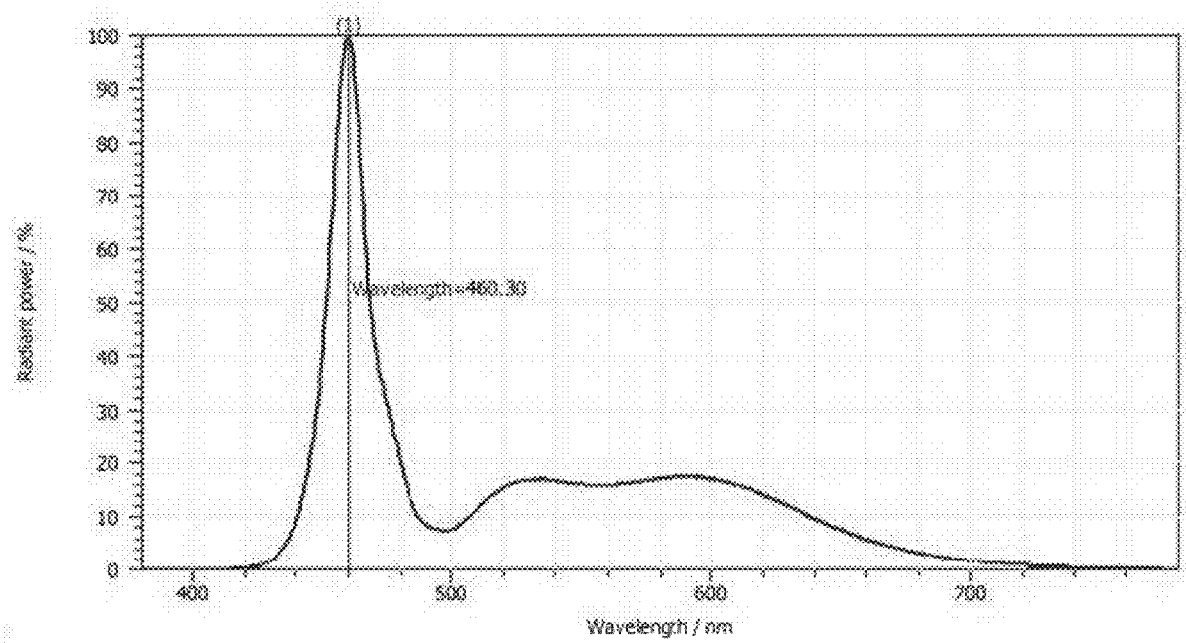
FIG. 2 is a spectrogram diagram of an LED white light device according to Embodiment 1 of the disclosure.
Figure 5:
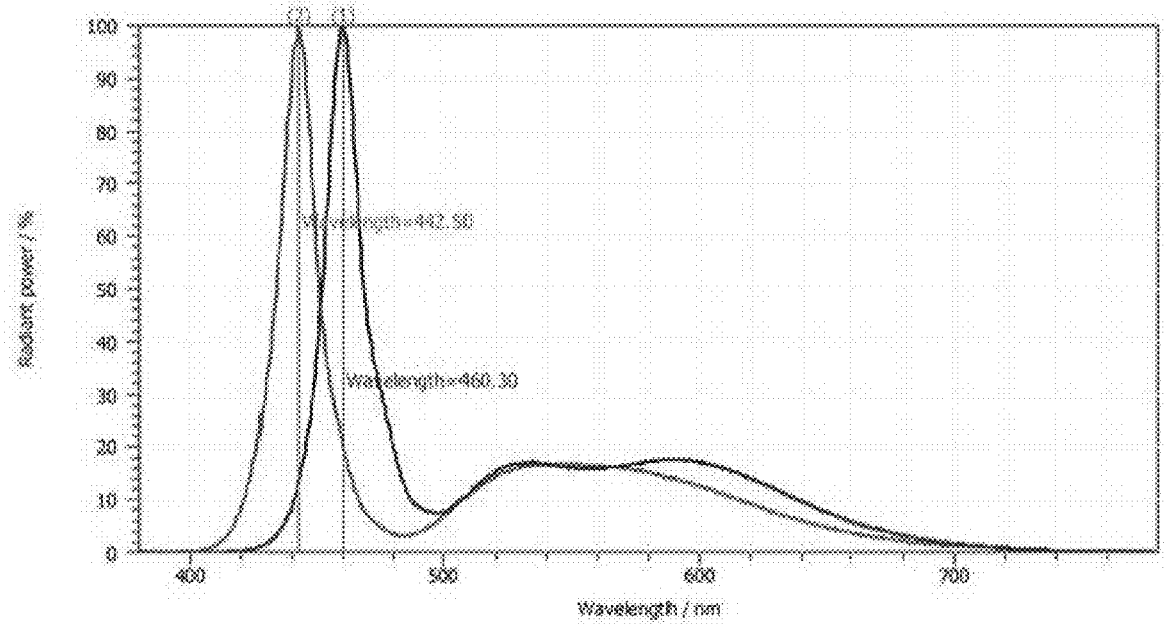
FIG. 5 is a spectrogram comparison diagram of an LED white light device according to Embodiment 1 of the disclosure with the existing technology.

As can be seen from FIGS. 2 and 5 and Table 1, the LED white light device has a blue light band peak wavelength of 460 nm, a green light band peak wavelength of 537 nm, a red light band peak wavelength of 630 nm, and a FWHM (Full Width Half Maximum) of 75 nm. The LED white light device has a blue-green-red three-color continuous spectrum, and is closer to a solar spectrum, the emitted light makes people feel comfortable and natural, and the LED white light device is beneficial to realize healthy illumination.

Figure 3:
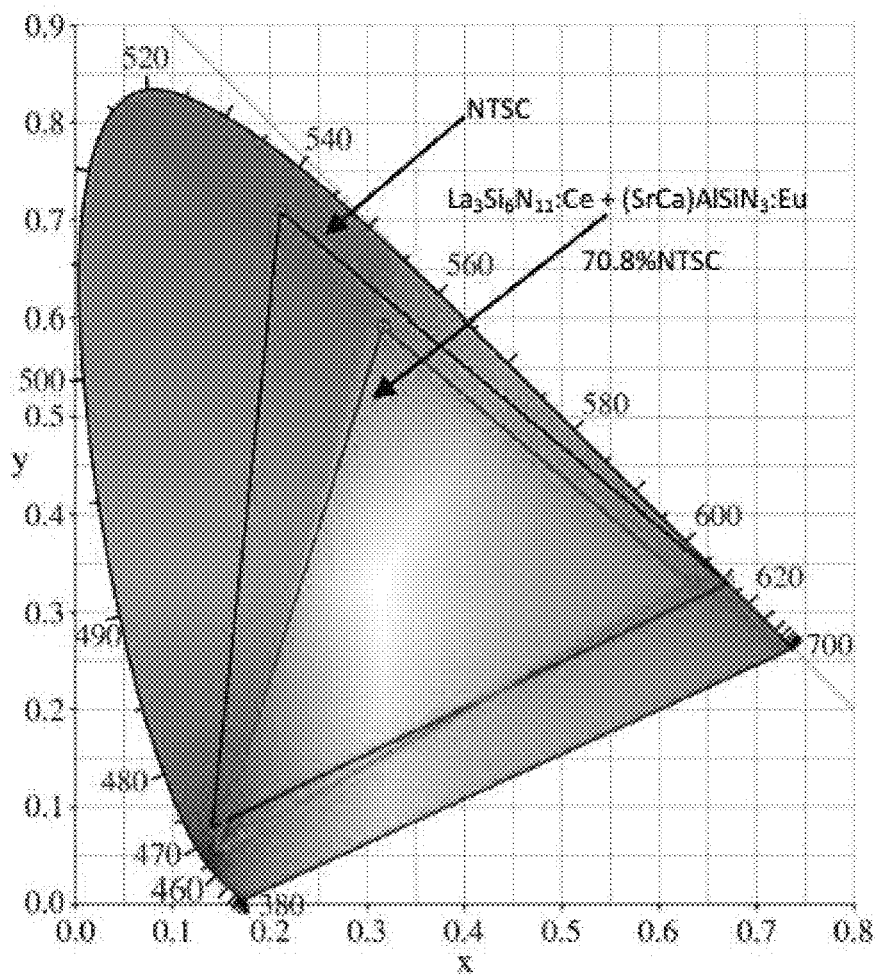
FIG. 3 is a color gamut diagram of an LED white light device according to Embodiment 1 of the disclosure.

As can be seen from FIG. 3, the LED white light device may have an NTSC color gamut value that is greater than or equal to 70%, and the color gamut is high.

Figure 4:
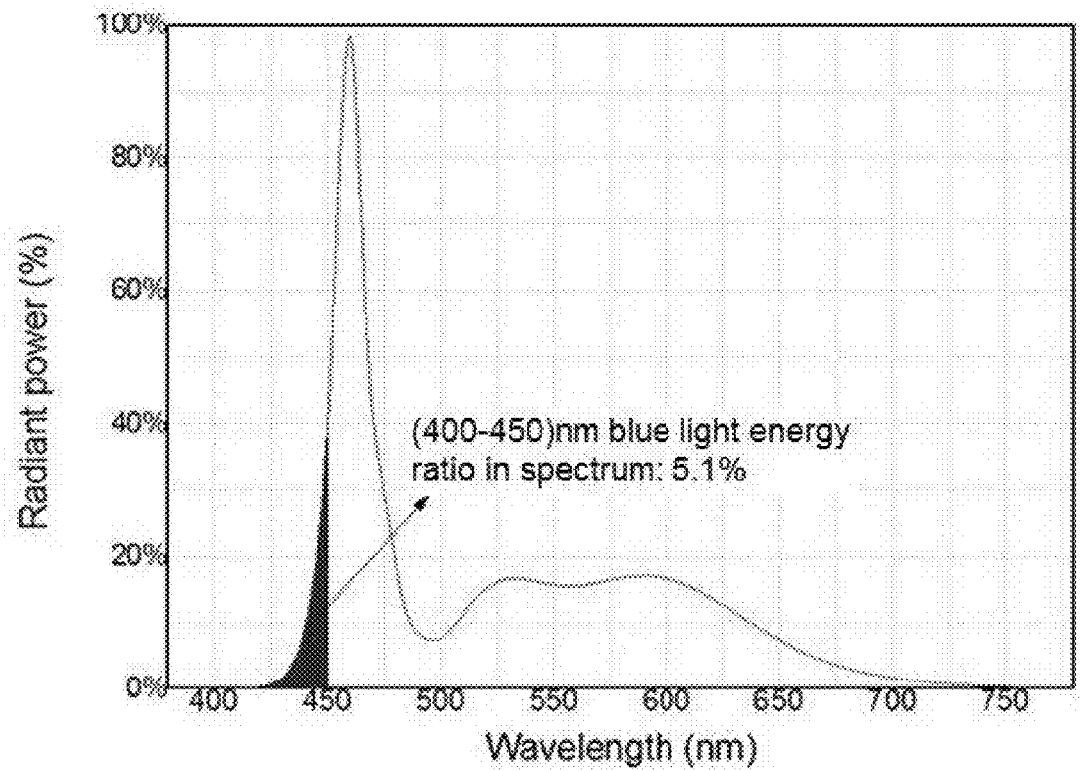
FIG. 4 is a diagram showing a ratio of blue light energy having a wavelength range of (400-450) nm in a spectrum of an LED white light device according to Embodiment 1 of the disclosure.

As can be seen from FIG. 4, a ratio of energy of a spectrum of the LED white light device to energy of a blue light spectrum having a wavelength range of (400-450) nm is 1:0.051, and the content of harmful blue light is low.

White light of the LED white light device has a chromaticity coordinate range of CIE x: 0.22-0.32 and CIE y: 0.20-0.32. The brightness is high, the color performance is natural, and the blue light preventing characteristic is provided, which makes human eyes feel more comfortable.

Embodiment 2

(1) A commercially available nitride yellow phosphor (component: $La_3Si_6N_{11}:Ce^{3+}$) and a nitride red phosphor (component: $(SrCa)AlSiN_3:Eu$) are added into an LED packaging glue in a ratio of 1:0.04. The red and yellow phosphors and the packaging glue are uniformly mixed by stirring, and defoamed by vacuuming to obtain a fluorescent glue mixture.

(2) The fluorescent glue mixture is dropped into an LED support with a blue light chip, and baked in an oven for a certain time to cure the fluorescent glue mixture to obtain an LED white light device for preventing blue light. The blue light chip selected for the LED device has a band of (455-470) nm, and a blue light peak wavelength corresponding to an LED emission spectrum is (450-465) nm.

Figure 6:
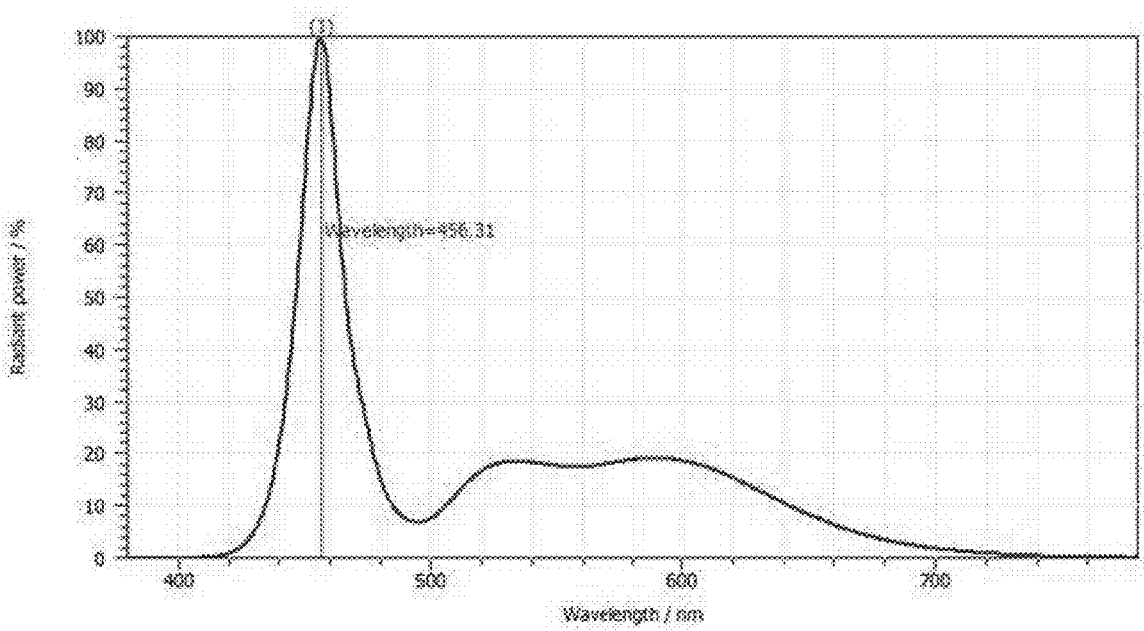
FIG. 6 is a spectrogram diagram of an LED white light device according to Embodiment 2 of the disclosure.
Figure 7:
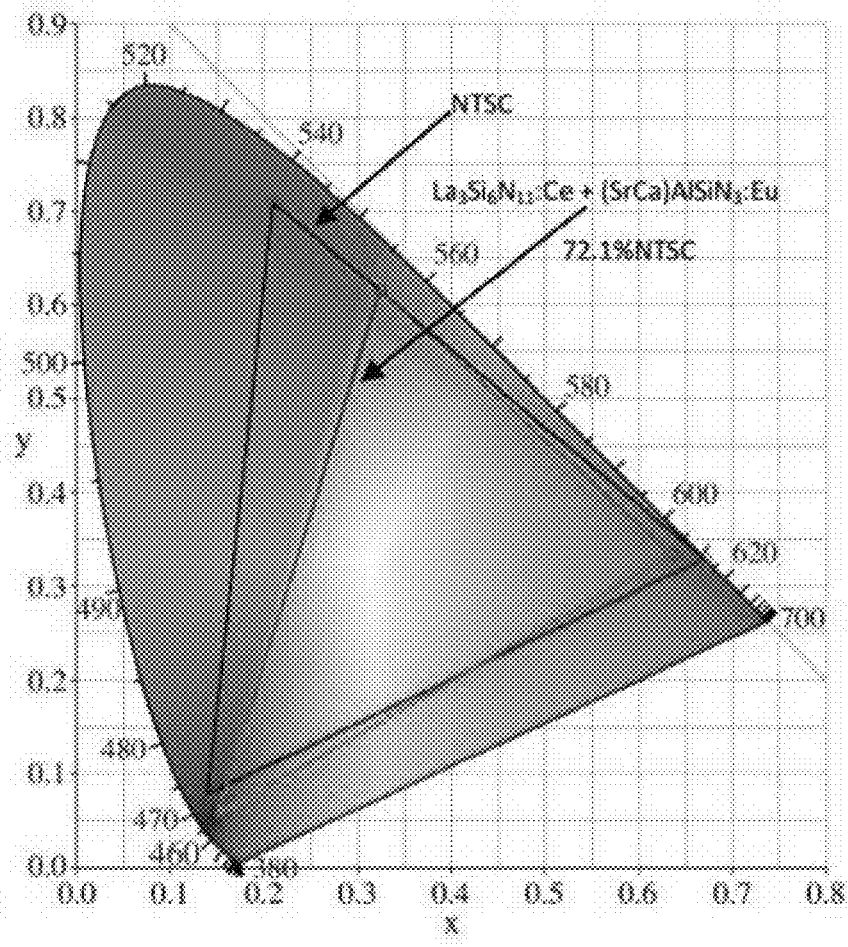
FIG. 7 is a color gamut diagram of an LED white light device according to Embodiment 2 of the disclosure.
Figure 8:
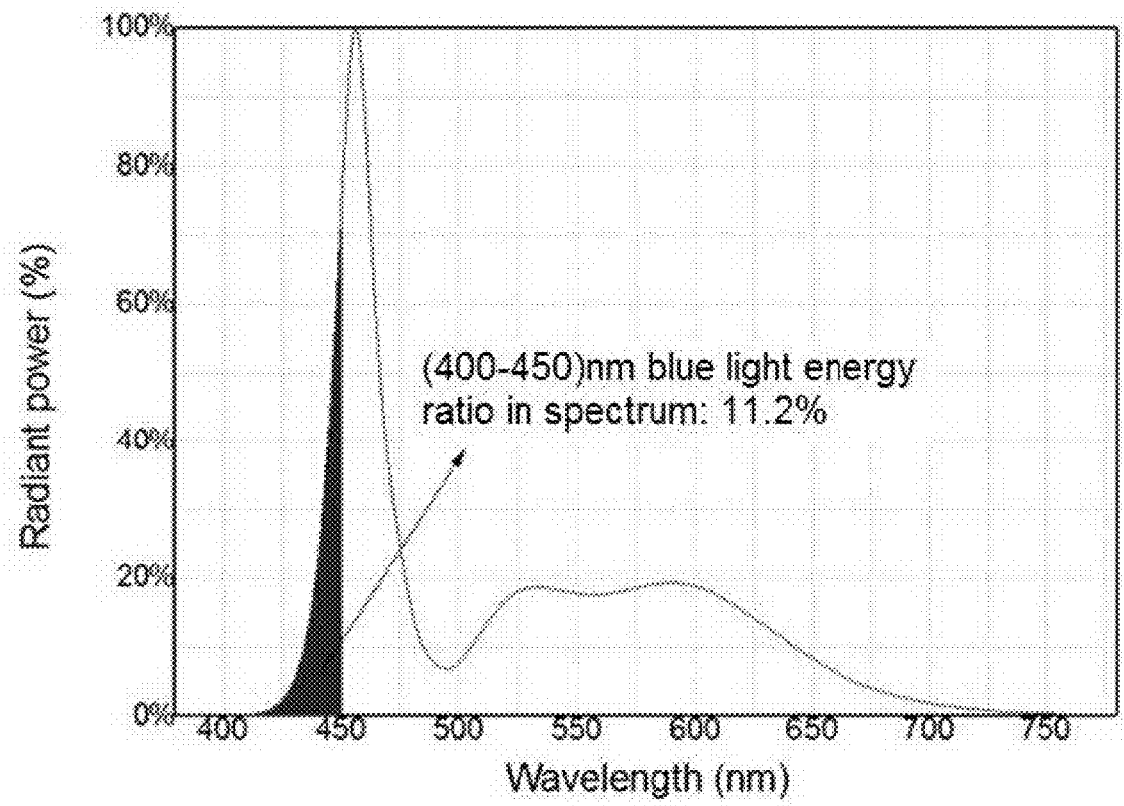
FIG. 8 is a diagram showing a ratio of blue light energy having a wavelength range of (400-450) nm in a spectrum of an LED white light device according to Embodiment 2 of the disclosure.

Spectral testing and color gamut calculation are performed on the LED white light device of Embodiment 2, and the results are shown in FIGS. 6, 7, and 8.

As can be seen from FIG. 6 and Table 1, the LED white light device has a blue light band peak wavelength of 456 nm, a green light band peak wavelength of 537 nm, a red light band peak wavelength of 630 nm, and a FWHM of 75 nm. The LED white light device has a blue-green-red three-color continuous spectrum, and is closer to a solar spectrum, the emitted light makes people feel comfortable and natural, and the LED white light device is beneficial to realize healthy illumination.

As can be seen from FIG. 7, the LED white light device may have an NTSC color gamut value that is greater than or equal to 70%, and the color gamut is high.

As can be seen from FIG. 8, a ratio of energy of a spectrum of the LED white light device to energy of a blue light spectrum having a wavelength range of (400-450) nm is 1:0.112, and the content of harmful blue light is low.

White light of the LED white light device has a chromaticity coordinate range of CIE x: 0.22-0.32 and CIE y: 0.20-0.32. The brightness is high, the color performance is natural, and the blue light preventing characteristic is provided, which makes human eyes feel more comfortable.

Embodiment 3

(1) A commercially available nitride yellow phosphor (component: $La_3Si\,N_{11}:Ce^{3+}$) and a nitride red phosphor (component: $(SrCa)AlSiN_3:Eu$) are added into an LED packaging glue in a ratio of 1:0.2. The red and yellow phosphors and the packaging glue are uniformly mixed by stirring, and defoamed by vacuuming to obtain a fluorescent glue mixture.

(2) The fluorescent glue mixture is dropped into an LED support with a blue light chip, and baked in an oven for a certain time to cure the fluorescent glue mixture to obtain an LED white light device for preventing blue light. The blue light chip selected for the LED device has a band of (455-470) nm, and a blue light peak wavelength corresponding to an LED emission spectrum is (450-465) nm.

Figure 9:
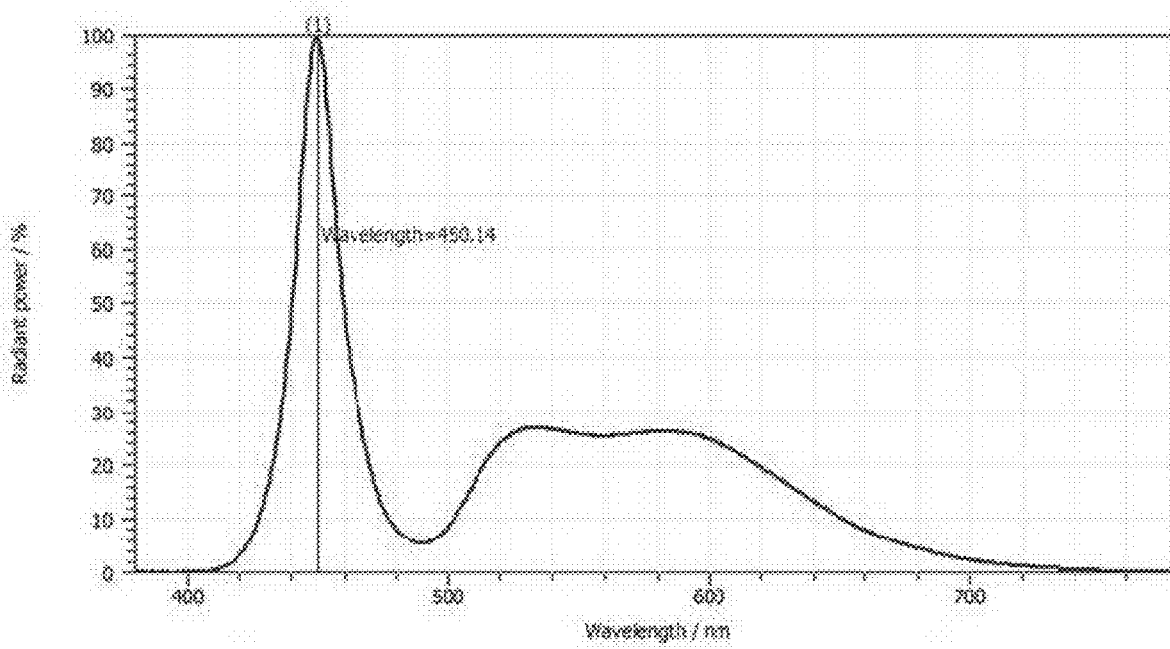
FIG. 9 is a spectrogram diagram of an LED white light device according to Embodiment 3 of the disclosure.
Figure 10:
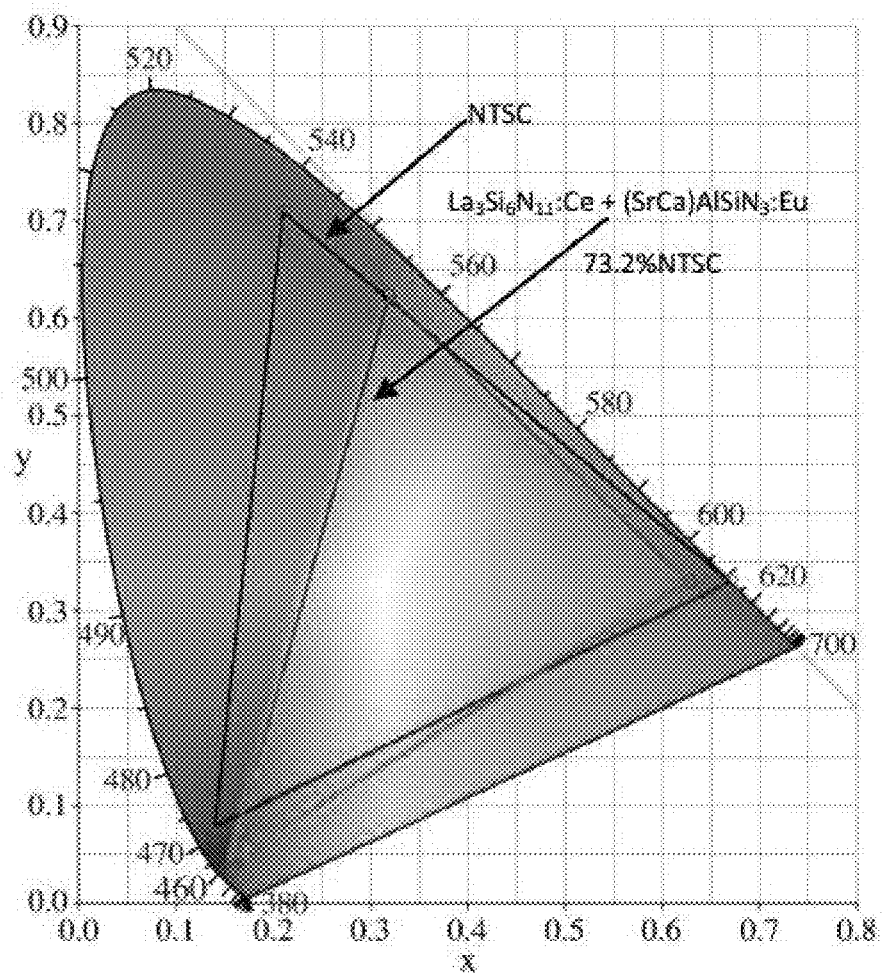
FIG. 10 is a color gamut diagram of an LED white light device according to Embodiment 3 of the disclosure.
Figure 11:
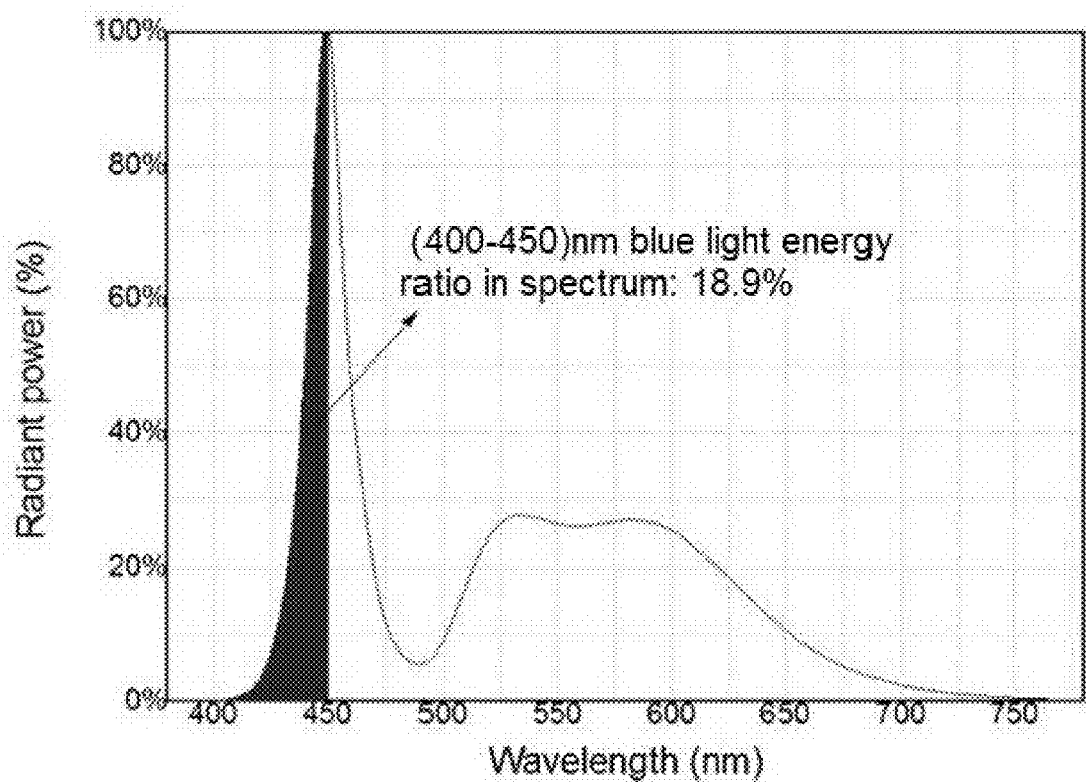
FIG. 11 is a diagram showing a ratio of blue light energy having a wavelength range of (400-450) nm in a spectrum of an LED white light device according to Embodiment 3 of the disclosure.

Spectral testing and color gamut calculation are performed on the LED white light device of Embodiment 3, and the results are shown in FIGS. 9, 10, and 11.

As can be seen from FIG. 9 and Table 1, the LED white light device has a blue light band peak wavelength of 450 nm, a green light band peak wavelength of 537 nm, a red light band peak wavelength of 630 nm, and a FWHM of 75 nm. The LED white light device has a blue-green-red three-color continuous spectrum, and is closer to a solar spectrum, the emitted light makes people feel comfortable and natural, and the LED white light device is beneficial to realize healthy illumination.

As can be seen from FIG. 10, the LED white light device may have an NTSC color gamut value that is greater than or equal to 70%, and the color gamut is high.

As can be seen from FIG. 11, a ratio of energy of a spectrum of the LED white light device to energy of a blue light spectrum having a wavelength range of 400-450 nm is 1:0.189, and the content of harmful blue light is low.

White light of the LED white light device has a chromaticity coordinate range of CIE x: 0.22-0.32 and CIE y: 0.20-0.32. The brightness is high, the color performance is natural, and the blue light preventing characteristic is provided, which makes human eyes feel more comfortable.

Embodiments 1-3 are compared with the existing technology, as follows:

(1) Existing technology: An yttrium-aluminum garnet phosphor (YAG powder) is excited by a blue light chip to be mixed to produce white light.

(2) Comparison results:
The technical parameters of the disclosure and the existing technology are as shown in Table 1 below.

Combining Table 1 and FIGS. 2-11, the white light device has high brightness, natural color performance and blue light preventing characteristics, can convert more than 95% of harmful blue light into long-wave low-energy light of 450 nm or more, solves the problem that blue light harms the eyes from the perspective of hardware, and reduces the damage caused by high-risk blue light to a user. Moreover, the LED white light device has a blue-green-red three-color continuous spectrum, and is closer to a solar spectrum, the emitted light makes people feel comfortable and natural, and the LED white light device is beneficial to realize healthy illumination.

However, the red light component of the luminescent spectrum in the existing technology is less, the color of an LED display effect is greenish, the color gamut value is 68% NTSC, the color expression is poor, and the blue light preventing effect is not obvious.

The above is a preferred implementation of the disclosure. It is to be noted that a number of modifications and refinements may be made by those of ordinary skill in the art without departing from the principles of the disclosure, and such modifications and refinements are also considered to be within the scope of protection of the disclosure.

What is claimed is:

1. An LED white light device, comprising a blue light chip and phosphors, wherein the blue light chip has a band of (455-470) nm;
    the phosphors consist of a dual-band yellow phosphor and a red phosphor having an excited light peak wavelength range of (610-660) nm; and
    the yellow phosphor and the red phosphor are mixed according to a proportion of 1:(0.03-0.2) and cover the blue light chip, wherein the yellow phosphor is a lanthanum silicon nitrogen compound, such that blue light emitted by the packaged LED white light device has a peak wavelength range of (450-465) nm, and a ratio of energy of a spectrum of the packaged LED white light device to energy of a blue light spectrum having a wavelength range of (400-450) nm is 1:(0.05-0.2); the yellow phosphor comprises $La_3Si_6N_{11}:Ce^{3+}$ having a peak wavelength of (530-550) nm and (600-620) nm.

2. The LED white light device as claimed in claim 1, wherein white light of the LED white light device has a chromaticity coordinate range of CIE x: 0.22-0.32 and CIE y: 0.20-0.32.

3. The LED white light device as claimed in claim 1, wherein the LED white light device has an NTSC color gamut value that is greater than or equal to 70%.

4. The LED white light device as claimed in claim 1, wherein the red phosphor is a nitride red phosphor or a $Mn^{4+}$ doped fluoride red phosphor.

5. The LED white light device as claimed in claim 4, wherein the red phosphor comprises $(SrCa)AlSiN_3:Eu$ having a peak wavelength of (610-660) nm.

| Item | Brightness (relative value) | Color gamut NTSC | Blue light peak wavelength/nm | Chromaticity coordinate (CIEx, CIEy) | (400-450)nm blue light energy ratio in spectrum |
|---|---|---|---|---|---|
| Embodiment 1 | 100% | 70.8% | 460.30 | (0.2783, 0.2464) | 5.1% |
| Embodiment 2 | 100% | 72.1% | 456.31 | (0.2786, 0.2467) | 11.2% |
| Embodiment 3 | 100% | 73.2% | 450.14 | (0.2791, 0.2470) | 18.9% |
| Existing technology | 100% | 68.3% | 442.50 | (0.2787, 0.2473) | 39.7% |

6. A preparation method of the LED white light device as claimed in claim 1, comprising:
   (1) mixing a yellow phosphor and a red phosphor in a proportion, adding the mixture into a packaging glue, stirring uniformly, and then defoaming by vacuuming to obtain a fluorescent glue mixture; and
   (2) providing the fluorescent glue mixture on an LED support with a blue light chip, and curing to obtain an LED white light device.

7. An LED backlight module, comprising the LED white light device as claimed in claim 1.

8. The preparation method as claimed in claim 6, wherein white light of the LED white light device has a chromaticity coordinate range of CIE x: 0.22-0.32 and CIE y: 0.20-0.32.

9. The preparation method as claimed in claim 6, wherein the LED white light device has an NTSC color gamut value that is greater than or equal to 70%.

10. The preparation method as claimed in claim 6, wherein the yellow phosphor is a lanthanum silicon nitrogen compound.

11. The preparation method as claimed in claim 10, wherein the yellow phosphor comprises $La_3Si_6N_{11}:Ce^{3+}$ having a peak wavelength of (530-550) nm and (600-620) nm.

12. The preparation method as claimed in claim 6, wherein the red phosphor is a nitride red phosphor or a $Mn^{4+}$ doped fluoride red phosphor.

13. The preparation method as claimed in claim 12, wherein the red phosphor comprises $(SrCa)AlSiN_3:Eu$ having a peak wavelength of (610-660) nm.

* * * * *